United States Patent
Noguchi

(10) Patent No.: US 9,076,653 B2
(45) Date of Patent: Jul. 7, 2015

(54) SUBSTRATE FOR GROWING SINGLE CRYSTAL DIAMOND LAYER AND METHOD FOR PRODUCING SINGLE CRYSTAL DIAMOND SUBSTRATE

(75) Inventor: Hitoshi Noguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1246 days.

(21) Appl. No.: 12/662,616

(22) Filed: Apr. 26, 2010

(65) Prior Publication Data

US 2010/0294196 A1 Nov. 25, 2010

(30) Foreign Application Priority Data

May 20, 2009 (JP) .................................. 2009-122415

(51) Int. Cl.
  *C30B 25/02* (2006.01)
  *H01L 21/205* (2006.01)
  (Continued)

(52) U.S. Cl.
  CPC ... *H01L 21/02527* (2013.01); *Y10T 428/24488* (2015.01); *Y10T 428/219* (2015.01); *H01L 21/02021* (2013.01); *C30B 25/02* (2013.01); *H01L 29/0657* (2013.01); *C30B 25/186* (2013.01); *C30B 25/20* (2013.01); *C30B 29/02* (2013.01); *C30B 29/04* (2013.01); *C30B 33/06* (2013.01); *H01L 21/02376* (2013.01); *H01L 21/02491* (2013.01); *H01L 21/02664* (2013.01)

(58) Field of Classification Search
  CPC ..................... H01L 21/02021; H01L 29/0657; H01L 21/02376; C30B 29/04; C30B 25/02
  USPC ........ 423/446; 117/86, 96, 98, 100, 101, 104, 117/929
  See application file for complete search history.

(56) References Cited

U.S. PATENT DOCUMENTS 5,279,992 A * 1/1994 Maejima et al. ............... 438/759
5,474,021 A * 12/1995 Tsuno et al. .................... 117/97
(Continued)

FOREIGN PATENT DOCUMENTS

| CN | 1929088 A | 3/2007 |
| JP | A-49-43881 | 4/1974 |

(Continued)

OTHER PUBLICATIONS

Bauer et al., "Epitaxial lateral overgrowth of homoepitaxial diamond through an iridium mesh," Diamond and Related Materials, 16 (2007) p. 711-717.*

(Continued)

*Primary Examiner* — Matthew Song
(74) *Attorney, Agent, or Firm* — Oliff PLC

(57) ABSTRACT

The present invention is a substrate for growing a single crystal diamond layer including: at least, a base material made of a single crystal diamond, and an iridium film or a rhodium film heteroepitaxially grown on a side of the base material where the single crystal diamond layer is to be grown; wherein a peripheral end portion of a surface of the base material on the side where the single crystal diamond layer is to be grown is chamfered with a curvature radius (r), the curvature radius satisfying (r)≥50 μm. As a result, there is provided a substrate for growing a single crystal diamond layer and a method for producing a single crystal diamond substrate, the substrate and the method in which a single crystal diamond having uniform and high crystallinity can be reproducibly produced at low cost.

17 Claims, 2 Drawing Sheets

(51) Int. Cl.
*H01L 21/02* (2006.01)
*H01L 29/06* (2006.01)
*C30B 25/18* (2006.01)
*C30B 25/20* (2006.01)
*C30B 29/02* (2006.01)
*C30B 29/04* (2006.01)
*C30B 33/06* (2006.01)

(56) References Cited

U.S. PATENT DOCUMENTS

| | | | | |
|---|---|---|---|---|
| 6,302,769 | B1 * | 10/2001 | Nishi et al. | 451/44 |
| 8,623,136 | B1 * | 1/2014 | Matthews et al. | 117/2 |
| 2003/0172864 | A1 * | 9/2003 | Tanaka et al. | 117/13 |
| 2007/0080366 | A1 | 4/2007 | Nishiura et al. | |

FOREIGN PATENT DOCUMENTS

| | | | |
|---|---|---|---|
| JP | A-2002-231996 | 8/2002 | |
| JP | A-2004-210559 | 7/2004 | |
| JP | A-2005-289706 | 10/2005 | |
| JP | A-2007-238377 | 9/2007 | |
| JP | A-2008-109125 | 5/2008 | |
| WO | WO 2008029258 A2 * | 3/2008 | C25B 11/12 |

OTHER PUBLICATIONS

Jul. 24, 2012 Notification of Reasons for Refusal Issued in Japanese Application No. 2009-122415 (with partial translation).
Oct. 1, 2013 Questioning (Report on Reconsideration by Examiner before Appeal) issued in Japanese Patent Application No. 2009-122415 with partial English-language translation.
Mar. 23, 2012 Chinese Office Action issued in Chinese Patent Application No. 201010167218.8 (with translation).
Mokuno et al., "High-rate growth of single crystalline diamond using microwave plasma CVD (IV)," 20$^{th}$ diamond symposium Lecture summary, 2006, pp. 6-7.
Ohtsuka et al., "Epitaxial Growth of Diamond on Iridium," Jpn. J. Appl. Phys., 1996, vol. 35, pp. L1072-L1074.
Japanese Office Action issued in Application No. 2009-122415; Dated Feb. 26, 2013 (With Partial Translation).

* cited by examiner

SUBSTRATE FOR GROWING SINGLE CRYSTAL DIAMOND LAYER AND METHOD FOR PRODUCING SINGLE CRYSTAL DIAMOND SUBSTRATE

BACKGROUND OF THE INVENTION

1. Field of the Invention

The present invention relates to a substrate for growing a single crystal diamond layer to produce a single crystal diamond substrate, and a method for producing a single crystal diamond substrate.

2. Description of the Related Art

Diamond has a wide band gap of 5.47 eV and a very high dielectric breakdown electric field intensity of 10 MV/cm. Furthermore, it has the highest thermal conductivity in materials. Therefore, if this is used for an electronic device, the device is advantageous as a high output power device. Furthermore, diamond has a high drift mobility and is the most advantageous as a high speed power device in semiconductors in comparison of Johnson performance index.

Accordingly, diamond is said to be the ultimate semiconductor suitable for high frequency/high power electronic devices. Therefore, studies of various kinds of electronic devices using a single crystal diamond for a substrate has progressed.

Now, the single crystal diamond substrate for producing a diamond semiconductor is diamond referred to as Ib type, which is formed by a high-pressure-high-temperature method (HPHT), or diamond referred to as IIa type, of which purity is enhanced.

However, it is difficult to grow in size while the HPHT method can provide the diamond having high crystallinity. Therefore, a price of the diamond becomes extremely high when its size becomes big and consequently, it is difficult to put into practical use as a substrate for the devices.

Accordingly, a CVD single crystal diamond formed by a vapor deposition method is also studied to provide a low cost substrate having a large area.

SUMMARY OF THE INVENTION

Recently, there was reported a homoepitaxial CVD single crystal diamond that is homoepitaxially grown directly on the HPHT single crystal diamond base material by the vapor deposition method (the 20th diamond symposium lecture summary (2006), pp. 6-7).

However, in this method, since the base material and the grown single crystal diamond are comprised of the same material, it is difficult to separate these. Therefore, there are cost problems since, for example, the base material needs to be implanted ions in advance and a lengthy wet etching separation treatment is needed after growth. Moreover, there is another problem that crystallinity of the single crystal diamond to be obtained deteriorates to a certain degree due to ion implantation of the base material.

As an alternative, there was reported a heteroepitaxial CVD single crystal diamond that is heteroepitaxially grown by a CVD method on a single crystal iridium film heteroepitaxially grown on a single crystal MgO base material (Jpn. J. Appl. Phys. Vol. 35 (1996), pp. L1072-L1074).

However, in this method, there is a problem that the base material and the grown single crystal diamond are finely broken due to stress (sum of internal stress and thermal stress) generated between the single crystal MgO base material and the single crystal diamond grown via the single crystal iridium (Ir). Moreover, crystallinity of the single crystal diamond to be obtained does not achieve a satisfactory level since crystallinity of an available single crystal MgO, which is the base material, is not sufficient.

The present invention was accomplished in order to solve the aforementioned problems, and its object is to provide a substrate for growing a single crystal diamond layer and a method for producing a single crystal diamond substrate, the substrate and the method which enable reproducibly producing a single crystal diamond having uniform and high crystallinity at low cost.

In order to accomplish the above object, the present invention provides a substrate for growing a single crystal diamond layer including: at least, a base material made of a single crystal diamond, and an iridium film or a rhodium film heteroepitaxially grown on a side of the base material where the single crystal diamond layer is to be grown; wherein a peripheral end portion of a surface of the base material on the side where the single crystal diamond layer is to be grown is chamfered with a curvature radius (r), the curvature radius satisfying (r)≥50 μm.

In the substrate for growing that includes the iridium film or the rhodium film heteroepitaxially grown on the base material made of a single crystal diamond as described above, the single crystal diamond layer can be grown with high crystallinity by growing it thereon. In addition, since a material of the base material is the same single crystal diamond as the single crystal diamond layer, excessive stress due to thermal expansion is not generated in either the layer to be grown or the base material. Consequently, even if it has a large area, a scratch and a break hardly occur in the single crystal diamond layer and in the base material while the single crystal diamond layer is grown with high crystallinity. After growing the single crystal diamond layer, appropriate stress is generated at the iridium film or the rhodium film so that the iridium film or the rhodium film functions as a good delaminating layer and thus a single crystal diamond substrate can be obtained by easily delaminating the single crystal diamond layer. Moreover, since the base material after delaminating has little damage such as a scratch, a break and the like, it can be reused as the base material. When the peripheral end portion of the surface of the base material on the side where the single crystal diamond layer is to be grown is chamfered with a curvature radius (r) and the curvature radius satisfies (r)≥50 μm, the iridium film, the rhodium film and the single crystal diamond layer can be surely grown with high crystallinity.

As described above, the substrate for growing a single crystal diamond layer according to the present invention enables reproducibly producing the single crystal diamond substrate having uniform and high crystallinity and having a large area at low cost.

In this case, it is preferable that the base material is circular.

The base material having a circular shape enables more easily growing the iridium film, the rhodium film and the single crystal diamond layer with good crystallinity.

In this case, it is preferable that the base material made of a single crystal diamond is a high-pressure-high-temperature-synthesis single crystal diamond or a vapor-deposited single crystal diamond.

Since this single crystal diamond has good crystallinity, the iridium film, the rhodium film and the single crystal diamond layer can be grown on the base material with higher crystallinity.

In this case, it is preferable that a thickness of the base material is not less than 0.03 mm and not more than 15.00 mm.

In this manner, when the thickness of the base material is not less than 0.03 mm, handling is easy. Moreover, since the base material having a thickness of 15.00 mm or less is relatively easily available, the substrate for growing a single crystal diamond layer can be easily fabricated at low cost.

In this case, it is preferable that the iridium film or the rhodium film heteroepitaxially grown is heteroepitaxially grown on the base material by a sputtering method.

In this manner, when the iridium film or the rhodium film is heteroepitaxially grown by the sputtering method, it can be grown at a sufficient growth rate and thereby the substrate for growing a single crystal diamond layer can be inexpensive and can be fabricated at higher productivity.

In this case, it is preferable that a thickness of the iridium film or the rhodium film heteroepitaxially grown is 5 Å to 100 μm.

In this manner, when the thickness is 5 Å or more crystallinity of the film is better. In addition, when the thickness is 100 μm or less, the single crystal diamond layer can be surely grown because stress that is generated between the base material and the single crystal diamond layer is small, and the film can be grown at low cost.

Furthermore, there is provided a method for producing a single crystal diamond substrate including: growing a single crystal diamond layer on the substrate for growing a single crystal diamond layer according to the present invention; delaminating the grown single crystal diamond layer at a portion of the iridium film or the rhodium film to produce the single crystal diamond substrate.

In this manner, use of the substrate for growing a single crystal diamond layer according to the present invention enables producing the single crystal diamond substrate having good crystallinity and a large area at low cost.

Furthermore, the present invention provides a method for producing a single crystal diamond substrate by growing a single crystal diamond layer and delaminating the single crystal diamond layer, including: growing an iridium film or a rhodium film on a base material heteroepitaxially, the base material being made of a single crystal diamond, a peripheral end portion of a surface of the base material on a side where the single crystal diamond layer is to be grown being chamfered with a curvature radius (r), the curvature radius satisfying (r)≥50 μm; growing the single crystal diamond layer on the iridium film or the rhodium film heteroepitaxially grown; and then delaminating the grown single crystal diamond layer at a portion of the iridium film or the rhodium film to produce the single crystal diamond substrate.

In this manner, when the iridium film or the rhodium film is heteroepitaxially grown on the base material and a single crystal diamond layer is grown thereon, the iridium film or the rhodium film functions as a good delaminating layer, and thereby the single crystal diamond layer can be easily delaminated. Thus, the single crystal diamond substrate can be produced by using a simple method. In addition, since a material of the base material is a single crystal diamond and is the same as the layer to be grown, excessive stress due to thermal expansion is not generated in the base material and the grown layer, and further the layer can be grown with higher crystallinity. Since the excessive stress is not generated in the base material, a break and a scratch hardly occurs and thereby the base material can have a large area and can be reused. When the peripheral end portion of the surface of the base material on the side where the single crystal diamond layer is to be grown is chamfered with a curvature radius (r) and the curvature radius satisfies (r)≥' 50 μm, the iridium film, the rhodium film and the single crystal diamond layer can be surely grown with good crystallinity.

As described above, the method for producing a single crystal diamond substrate according to the present invention enables producing the single crystal diamond substrate having uniform and good crystallinity and having a large area at low cost.

In this case, it is preferable that a diamond nucleus is formed by performing a bias treatment on a surface of the iridium film or the rhodium film heteroepitaxially grown and the single crystal diamond layer is grown by a microwave CVD method or a direct-current plasma CVD method on the surface on which the bias treatment is performed.

In this manner, when the bias treatment is performed to form the diamond nucleus in advance, the single crystal diamond layer is grown with good crystallinity at a sufficient growth rate.

As mentioned above, the substrate for growing a single crystal diamond layer or the method for producing a single crystal diamond substrate according to the present invention enables producing the single crystal diamond substrate having uniform and good crystallinity and having a large area at low cost.

DETAILED DESCRIPTION OF THE PREFERRED EMBODIMENTS

Hereinafter, an example of embodiments of the substrate for growing a single crystal diamond layer and the method for producing a single crystal diamond substrate according to the present invention will be explained in detail with reference to the drawings. However the present invention is not restricted thereto.

Figure 1:
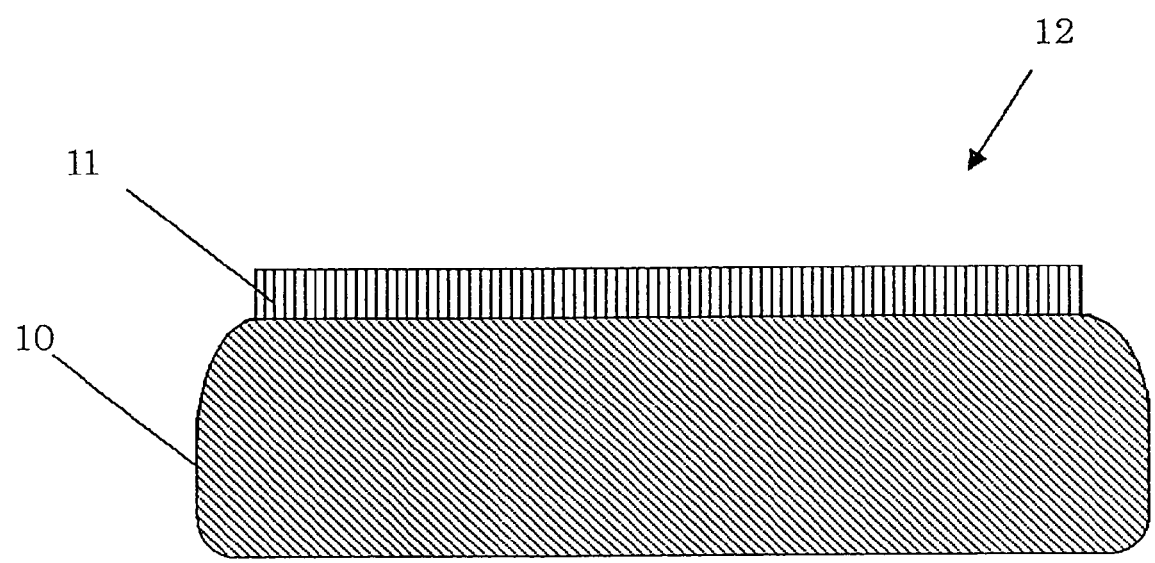
FIG. 1 is a schematic view showing an example of embodiments of the substrate for growing a single crystal diamond layer according to the present invention.
Figure 2:
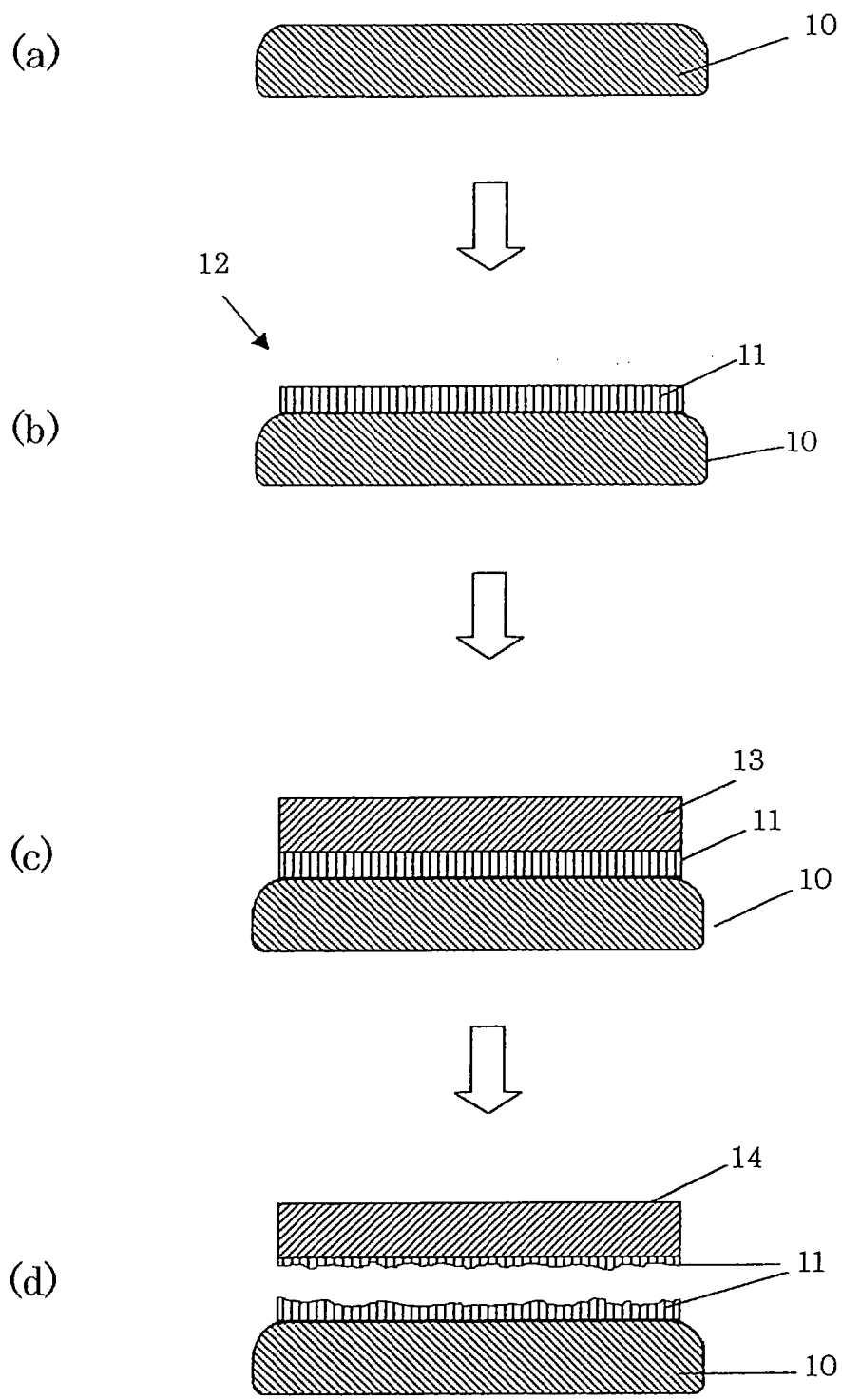
FIG. 2 is a flow chart showing an example of embodiments of the method for producing a single crystal diamond substrate according to the present invention.

FIG. 1 is a schematic view showing an example of embodiments of the substrate for growing a single crystal diamond layer according to the present invention. FIG. 2 is a flow chart showing an example of embodiments of the method for producing a single crystal diamond substrate according to the present invention.

First, as shown in FIG. 1, the substrate for growing a single crystal diamond layer according to the present invention is a substrate 12 that is used for growing the single crystal diamond layer. The substrate 12 comprises the base material 10 that is made of a single crystal diamond and the iridium (Ir) film or the rhodium (Rh) film 11 heteroepitaxially grown on the side of the base material 10 where the single crystal diamond layer is to be grown. The peripheral end portion of the surface of the base material on the side where the single crystal diamond layer is to be grown is chamfered with a curvature radius (r) and the curvature radius satisfies (r)≥50 μm.

In the substrate for growing that includes the iridium film or the rhodium film heteroepitaxially grown on the base material made of a single crystal diamond as described above, the single crystal diamond layer can be grown with good crystallinity by growing it on the film. In addition, since a material of the base material is the same single crystal diamond as the single crystal diamond layer, excessive stress due to thermal expansion is not generated either in the layer to be grown or in the base material. Consequently, a scratch and a break hardly occur in the single crystal diamond layer and in the base material while the single crystal diamond layer having a large area is grown with good crystallinity. After growing the single crystal diamond layer, appropriate stress is generated at the iridium film or the rhodium film so that the iridium film or the rhodium film functions as a good delaminating layer and thus a single crystal diamond substrate can be obtained by easily delaminating the single crystal diamond layer. Moreover, since the base material after delaminating has little damage such as a scratch, a break and the like, it can be reused as the base material. Therefore, production costs of the single crystal diamond substrate can be notably reduced. Furthermore, when the peripheral end portion of the surface of the base material on the side where the single crystal diamond layer is to be grown is chamfered with a curvature radius (r) and the curvature radius satisfies (r)≥50 µm, the iridium film, the rhodium film and the single crystal diamond layer can be surely grown with good crystallinity.

As shown in FIG. 1, it is preferable that a shape of the base material 10 is circular in addition that the peripheral end portion of the surface of the base material 10 on the side where the single crystal diamond layer is to be grown is chamfered with a curvature radius (r) and the curvature radius satisfies (r)≥50 µm.

In many cases, the base material made of a single crystal diamond normally is polygon-shaped and greatly tapered at an end portion since a growth rate varies with a crystal orientation in a fabrication stage thereof. This tendency becomes notable in the case of large-size exceeding 5 mm. In the case that the base material having the shape described above is subjected to electric discharge process such as a film-forming or a pretreatment in a subsequent processing step, it is possible that sufficient processing effects cannot be achieved since plasma is unstable and nonuniform. Therefore, the base material is formed into a circular shape that has high parallelism, that is, that is not tapered. In addition, the peripheral end portion of a surface of the base material on the side where the discharge process such as the film-forming or the pretreatment is to be performed is chamfered. The base material having a circular shape as described above enables more easily growing the iridium film, the rhodium film and the single crystal diamond layer with good crystallinity.

The present inventor found as follows. Even though the base material is made of a single crystal diamond, it is difficult to grow the iridium film, the rhodium film and the single crystal diamond layer with good crystallinity on the base material in which the peripheral end portion of the surface on the side where the single crystal diamond layer is to be grown is not chamfered with a curvature radius (r), the curvature radius satisfying (r)≥50 µm. In this case, it is nearly impossible to obtain a desired single crystal diamond substrate having a large area. Accordingly, the present inventor thought of chamfering the peripheral end portion of the surface on the side where the single crystal diamond layer is to be grown with a curvature radius (r), the curvature radius satisfying (r)≥50 µm.

A processing method of the base material 10 is not restricted in particular. For example, the base material is shaped by a laser cutting method or a polishing method and its peripheral end portion is chamfered by a grinding wheel.

In this case, it is preferable that the base material 10 made of a single crystal diamond is, for example, a high-pressure-high-temperature-synthesis single crystal diamond or a vapor-deposited single crystal diamond.

Since this single crystal diamond has good crystallinity, the single crystal diamond layer can be grown over the base material with better crystallinity.

A thickness of the base material 10 is also not restricted in particular, but it is preferable that the thickness of the base material is not less than 0.03 mm and not more than 15.00 mm.

In this manner, when the thickness of the base material is not less than 0.03 mm, handling is easy. Moreover, since the base material having a thickness of 15.00 mm or less is relatively easily available, the substrate for growing a single crystal diamond layer can be easily fabricated at low cost.

In this case, it is preferable that the iridium film or the rhodium film 11 heteroepitaxially grown is heteroepitaxially grown on the base material 10 by the sputtering method.

In this manner, when the iridium film or the rhodium film is heteroepitaxially grown by the sputtering method such as a R. F. magnetron sputter method, it can be grown at a sufficient growth rate and thereby the substrate for growing a single crystal diamond layer can be fabricated at high productivity.

In this case, it is preferable that a thickness of the iridium film or the rhodium film heteroepitaxially grown is 5 Å to 100 µm.

In this manner, when the thickness is 5 Å or more crystallinity of the film is better. In addition, when the thickness is 100 µm or less, the single crystal diamond layer can be surely grown because stress that is generated between the base material and the single crystal diamond layer is small, and the film can be grown at low cost. In addition, the foregoing thickness makes delamination of the single crystal diamond layer after growing easy.

Hereinafter, the method for producing a single crystal diamond substrate according to the present invention will be explained as an example of embodiments of fabricating the substrate for growing a single crystal diamond layer as described above and producing a single crystal diamond substrate using the substrate for growing a single crystal diamond layer.

First, as shown in FIG. 2(a), there is prepared, for example, a high-pressure-high-temperature-synthesis single crystal diamond or a vapor-deposited single crystal diamond as the base material 10 made of a single crystal diamond in the method for producing according to the present invention. The peripheral end portion of the surface of the base material 10 on the side where the single crystal diamond layer is to be grown is chamfered in such a manner that the curvature radius satisfies (r)≥50 µm.

A shape and the like of the base material 10 is not restricted in particular. The base material having a circular shape can be prepared as well as the foregoing base material of the substrate for growing a single crystal diamond layer according to the present invention. The foregoing regarding the chamfered shape, the thickness of the base material and the like are also preferably adopted.

Next, as shown in FIG. 2(b), the substrate for growing a single crystal diamond layer 12 according to the present invention is fabricated by heteroepitaxially growing the iridium film or the rhodium film 11 with a thickness of 5 Å to 100 µm on the base material 10, for example, by using the sputtering method.

Since the base material is made of a single crystal diamond and has good crystallinity, the iridium film and the rhodium film can be grown with good crystallinity thereon. Moreover, since the base material has a chamfered portion with the curvature radius of the present invention, treatments and the growth can be uniformly performed.

Next, as shown in FIG. 2(c), the single crystal diamond layer 13 is grown on the iridium film or the rhodium film 11 heteroepitaxially grown.

Since the material of the base material is the same single crystal diamond as the layer to be grown, excessive stress is not generated in the base material and the grown layer even if thermal expansion occurs. Moreover, since the peripheral end portion of the surface of the base material on the side where the single crystal diamond layer is to be grown is chamfered in such a manner that the curvature radius satisfies (r)≥50 μm, the single crystal diamond layer having a large area can be grown with good crystallinity.

In this case, it is preferable that the surface of the iridium film or the rhodium film 11 heteroepitaxially grown is subjected to the bias treatment to form the diamond nucleus in advance and the single crystal diamond layer 13 is grown by the microwave CVD method or the direct-current plasma CVD method on the surface subjected to the bias treatment.

The bias treatment may be a method referred to as the bias treatment described in Japanese Patent Laid-open (Kokai) No. 2007-238377. First, a pretreatment for forming the diamond nucleus is performed by a direct-current discharge in which an electrode of the base material side is a cathode. The diamond nucleus having a uniform orientation is consequently formed on the surface of the iridium (Ir) film or the rhodium (Rh) film by the pretreatment and successively the single crystal diamond is heteroepitaxially grown by the microwave CVD method or the direct-current plasma CVD method on the substrate subjected to the bias treatment.

In this manner, when the bias treatment is performed to form the diamond nucleus in advance, the target single crystal diamond layer can be grown with good crystallinity at a sufficient growth rate.

Next, as shown in FIG. 2(d), the grown single crystal diamond layer 13 is delaminated at the portion of the iridium film or the rhodium film 11 to produce the single crystal diamond substrate 14. After growth of the single crystal diamond layer, since the iridium film or the rhodium film is a good delaminating layer due to the appropriate stress applied to the film from the layer and the base material, the single crystal diamond layer can be easily delaminated when it is taken out from an apparatus for growing the single crystal diamond layer such as a CVD apparatus.

In the case that an adhesion force remains between the base material (or the iridium film, the rhodium film) and the single crystal diamond layer after taking out it from the apparatus, the layer can be easily delaminated by immersing in pure water or wet etching solution, such as phosphoric acid solution and the like.

In this manner, the substrate for growing a single crystal diamond layer and the method for producing a single crystal diamond substrate according to the present invention enables producing the single crystal diamond substrate with high crystallinity at low cost, the single crystal diamond substrate which can be used for a device.

On the other hand, the base material after delaminating can be reused as the base material of a single crystal diamond by removing the iridium film or the rhodium film and performing a polishing process to expose a clean surface of the single crystal diamond of the base material. The cost can be further reduced by the reuse.

It is to be noted that the case of directly growing the iridium film or the rhodium film on the base material, and growing the single crystal diamond layer on the film is explained in the foregoing substrate for growing a single crystal diamond layer and the foregoing method for producing a single crystal diamond substrate according to the present invention. However, the present invention is not restricted thereto, and any other layers, such as a buffer layer, may be grown before growing the iridium film, the rhodium film or the single crystal diamond layer.

EXAMPLES

Hereinafter, the present invention will be more specifically explained by showing Examples and Comparative Examples. However, the present invention is not restricted thereto.

Example 1

As the base material, there was prepared a rough-polished HPHT single crystal diamond having a tapered octahedron shape with approximately a diameter of 7.0 mm, a thickness of 1.0 mm and an orientation (100). The base material was shaped into a circular shape with a diameter of 6.0 mm and a thickness of 0.7 mm without a tapered portion by using the laser cutting method and the polishing method, and then the peripheral end portion of the surface on the side where the diamond was to be formed was chamfered with the curvature radius (r)=150 μm. After that, its upper surface was subjected to a polishing process to finish with Ra≤1 nm.

The Ir film was heteroepitaxially grown on the surface of the base material on the side where the single crystal diamond was to be grown, and thereby the substrate for growing a single crystal diamond layer is fabricated. The film-forming was completed to sputter in a condition that Ar gas of $6\times10^{-2}$ Torr (8 Pa) and a base material temperature of 700 C.° by the R. F. magnetron sputter method in which an target is Ir until a thickness of the single crystal Ir film became 1.5 μm.

For the sake of electrical continuity in the bias treatment and the direct-current plasma CVD, the Ir film having a thickness of 1.5 μm was also grown on a back surface in the same condition except for making the base material temperature 100 C.°.

Next, the bias treatment was performed for forming the diamond nucleus on the surface of the single crystal Ir film of the substrate.

First, the substrate was set on a negative voltage-applying electrode (cathode) of a bias treatment apparatus, and then evacuation was performed. Next, after the substrate was heated to 600 C.°, a hydrogen-diluted methane gas of 3 vol. % was introduced so that pressure became 120 Torr (160 hPa). Then, the bias treatment was performed. That is, DC voltage was applied to both the electrodes to apply a prescribed direct current.

Last, the single crystal diamond was heteroepitaxially grown at 900 C.° for 30 hours by DC plasma CVD method on the substrate that is subjected to the bias treatment.

After finishing the growth and making sure that the product was cooled to room temperature, the atmosphere was introduced into a chamber and a bell jar was opened. In the product on a positive voltage-applying electrode (anode), a portion of the single crystal diamond heteroepitaxially grown was separated from a portion of the substrate.

The grown single crystal diamond portion was polished so that the single crystal diamond was finished to have approximately a diameter of 6.0 mm and a thickness of 150 μm, that is nearly the same size as the substrate.

It was confirmed that the obtained single crystal diamond had sufficient crystallinity as a result of evaluation by raman spectroscopy, XRD rocking curve, cross-sectional TEM and cathodoluminescence (CL).

On the other hand, the substrate was polished to remove the Ir and to expose a clean surface of a single crystal diamond of the base material, and then it was able to be reused as a single crystal diamond of the base material.

Example 2

Except for making the growth time of the single crystal diamond 9 hours in the last direct-current plasma CVD method, the single crystal diamond was produced in a condition similar to that in Example 1. Then, it was made sure that the product was cooled to room temperature, the atmosphere was introduced into the chamber and the bell jar was opened. In this case, a portion of the single crystal diamond heteroepitaxially grown and a portion of the substrate were adhered with a weak force in the product on the anode. Accordingly, the product was immersed in boiled pure water for 1 hour and was taken out. As a result, the portion of the single crystal diamond was able to be separated from the portion of the substrate. Although there was a portion that the Ir slightly remained on the surface of the Ir side of the separated single crystal diamond, it was able to be easily removed by a subsequent polishing process.

The portion of the grown single crystal diamond was polished so that the single crystal diamond was finished to have approximately a diameter of 6.0 mm and a thickness of 50 μm, that is nearly the same size as the substrate.

It was confirmed that the obtained single crystal diamond had sufficient crystallinity as a result of evaluation by raman spectroscopy, XRD rocking curve, cross-sectional TEM and cathodoluminescence (CL).

On the other hand, the substrate was polished to remove the Ir and to expose a clean surface of a single crystal diamond of the base material, and then it was able to be reused as a single crystal diamond of the base material.

Comparative Example 1

As the base material, there was prepared a rough-polished HPHT single crystal diamond having a tapered octahedron shape with approximately a diameter of 7.0 mm, a thickness of 1.0 mm and an orientation (100). The surface on the side where the single crystal diamond was to be grown was subjected to a polishing process to finish with Ra≤1 nm. Except for using this base material (without chamfering), the Ir was grown, the bias treatment was performed and the single crystal diamond was heteroepitaxially grown by the direct-current plasma CVD method thereon as with Example 1.

The discharge was unstable in the bias treatment, a luminescence portion moved on a corner of the upper portion of the substrate and there was also luminescence in a space between a lower portion of the substrate and a stage. Uniformity of the plasma was also low in the upper surface of the substrate due to the influence of unstableness of the discharge and thereby sufficient processing effects were not able to be obtained. After that, the single crystal diamond was heteroepitaxially grown by the direct-current plasma CVD method. The bell jar was opened to observe the product in the chamber. As a result, the single crystal diamond having a diameter of about 2 mm at the center of the substrate was grown, and other portions were polycrystalline diamond. In this case, there was also observed a large particle, which was the polycrystalline diamond abnormally grown, at the peripheral end portion of the upper surface of the substrate.

Therefore, both of the crystallinity and the productivity were degraded in comparison with Example 1 and 2, and consequently the desired single crystal diamond having a large area was not able to be obtained.

Comparative Example 2

Except for using a single crystal MgO that was finished by a single-side polishing process to have a diameter of 6.0 mm, a thickness of 0.7 mm, an orientation (100) and a chamfered portion with r=150 μm in the peripheral end portion of its upper side as the base material, the Ir was grown, the bias treatment was performed and the single crystal diamond was heteroepitaxially grown by the direct-current plasma CVD method thereon as with Example 1. Then, the bell jar was opened to observe the product in the chamber. As a result, both of the base material and a portion of the grown single crystal diamond were broken into fine pieces having an approximate 1.0 mm square.

One of the pieces of the single crystal diamond was taken out and its crystallinity was evaluated. As a result, it was observed that raman full width at half maximum was wide and a lot of dislocation defects existed in cross-sectional TEM. Thus, the crystallinity was insufficient level for a device.

Naturally, the reuse of the single crystal MgO broken into pieces was impossible.

Example 3 and Comparative Example 3

Except for chamfering the peripheral end portion of the surface of the base material on the side where the diamond was to be formed with the curvature radius (r)=30, 40, 50, 60 and 70 μm respectively, the Ir was grown, the bias treatment was performed and the single crystal diamond was heteroepitaxially grown by the direct-current plasma CVD method thereon as with Example 1. Hereinafter, the result will be shown in table 1. There was shown by X in the case that a result was comparable in crystallinity and in diameter of the obtained single crystal diamond to Comparative Example 1 in which a chamfering process was not performed. There was shown by ◯ in the case that the single crystal diamond substrate having a desired diameter was able to be obtained.

TABLE 1

| curvature radius (μm) | 30 | 40 | 50 | 60 | 70 |
|---|---|---|---|---|---|
| crystal evaluation | x | x | ◯ | ◯ | ◯ |

As shown in table 1, in the base material to which a chamfering process was performed with a curvature radius of 30 and 40 μm respectively (Comparative Example 3), the discharge was nonuniform, the growth was insufficient and a portion of the single crystal diamond that was slightly grown had low crystallinity. On the other hand, in the base material to which a chamfering process was performed with a curvature radius of 50, 60 and 70 μm respectively (Example 3), the single crystal diamond substrate having a desired diameter of 6 mm was able to be obtained. However, in the case of a curvature radius of 50 μm, the crystallinity was inferior in comparison with the case of a curvature radius of 150 μm in Example 1, and in the case of a curvature radius of 70 μm, the single crystal diamond substrate having the crystallinity comparable to Example 1 was able to be obtained.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A substrate for growing a single crystal diamond layer comprising: at least, a base material made of a single crystal diamond, and an iridium film or a rhodium film heteroepitaxially grown on a side of the base material where the single crystal diamond layer is to be grown; wherein a peripheral end portion of a surface of the base material on the side where the single crystal diamond layer is to be grown is chamfered with a curvature radius (r), the curvature radius satisfying 50 µm≤(r)≤70 µm.

2. The substrate for growing a single crystal diamond layer according to claim 1, wherein the base material is circular.

3. The substrate for growing a single crystal diamond layer according to claim 1, wherein the base material made of a single crystal diamond is a high-pressure-high-temperature-synthesis single crystal diamond or a vapor-deposited single crystal diamond.

4. The substrate for growing a single crystal diamond layer according to claim 1, wherein a thickness of the base material is not less than 0.03 mm and not more than 15.00 mm.

5. The substrate for growing a single crystal diamond layer according to claim 2, wherein a thickness of the base material is not less than 0.03 mm and not more than 15.00 mm.

6. The substrate for growing a single crystal diamond layer according to claim 3, wherein a thickness of the base material is not less than 0.03 mm and not more than 15.00 mm.

7. The substrate for growing a single crystal diamond layer according to claim 1, wherein the iridium film or the rhodium film heteroepitaxially grown is heteroepitaxially grown on the base material by a sputtering method.

8. The substrate for growing a single crystal diamond layer according to claim 1, a thickness of the iridium film or the rhodium film heteroepitaxially grown is 5 Å to 100 µm.

9. The substrate for growing a single crystal diamond layer according to claim 2, a thickness of the iridium film or the rhodium film heteroepitaxially grown is 5 Å to 100 µm.

10. The substrate for growing a single crystal diamond layer according to claim 3, a thickness of the iridium film or the rhodium film heteroepitaxially grown is 5 Å to 100 µm.

11. The substrate for growing a single crystal diamond layer according to claim 4, a thickness of the iridium film or the rhodium film heteroepitaxially grown is 5 Å to 100 µm.

12. The substrate for growing a single crystal diamond layer according to claim 5, a thickness of the iridium film or the rhodium film heteroepitaxially grown is 5 Å to 100 µm.

13. The substrate for growing a single crystal diamond layer according to claim 6, a thickness of the iridium film or the rhodium film heteroepitaxially grown is 5 Å to 100 µm.

14. The substrate for growing a single crystal diamond layer according to claim 7, a thickness of the iridium film or the rhodium film heteroepitaxially grown is 5 Å to 100 µm.

15. A method for producing a single crystal diamond substrate comprising: growing a single crystal diamond layer on the substrate for growing a single crystal diamond layer according to claim 1; delaminating the grown single crystal diamond layer at a portion of the iridium film or the rhodium film to produce the single crystal diamond substrate.

16. A method for producing a single crystal diamond substrate by growing a single crystal diamond layer and delaminating the single crystal diamond layer, comprising:

growing an iridium film or a rhodium film on a base material heteroepitaxially, the base material being made of a single crystal diamond, a peripheral end portion of a surface of the base material on a side where the single crystal diamond layer is to be grown being chamfered with a curvature radius (r), the curvature radius satisfying 50 µm≤(r)≤70 µm;

growing the single crystal diamond layer on the iridium film or the rhodium film heteroepitaxially grown; and then delaminating the grown single crystal diamond layer at a portion of the iridium film or the rhodium film to produce the single crystal diamond substrate.

17. The method for producing a single crystal diamond substrate according to claim 16, wherein a diamond nucleus is formed by performing a bias treatment on a surface of the iridium film or the rhodium film heteroepitaxially grown, and the single crystal diamond layer is grown by a microwave CVD method or a direct-current plasma CVD method on the surface on which the bias treatment is performed.

* * * * *